United States Patent [19]
Okoshi et al.

[11] Patent Number: 5,601,428
[45] Date of Patent: Feb. 11, 1997

[54] VERTICAL HEAT-TREATING APPARATUS AND HEAT INSULATOR

[75] Inventors: Shinichi Okoshi, Yamagata; Hiroyuki Kimura, Fukui, both of Japan

[73] Assignee: Shin-Etsu Quartz Products Co. Ltd., Tokyo, Japan

[21] Appl. No.: 540,136

[22] Filed: Oct. 6, 1995

Related U.S. Application Data

[62] Division of Ser. No. 170,164, Dec. 23, 1993, Pat. No. 5,480,300.

[51] Int. Cl.⁶ .............................................. F27D 3/12
[52] U.S. Cl. ............................................ 432/241; 432/152
[58] Field of Search ........................... 432/28, 30, 152, 432/176, 205, 214, 215, 216, 217, 218, 241

[56] References Cited

U.S. PATENT DOCUMENTS 5,480,300  1/1996  Okoshi et al. ..................... 432/241

FOREIGN PATENT DOCUMENTS 64-47020  2/1989  Japan .

*Primary Examiner*—Noah P. Kamen
*Attorney, Agent, or Firm*—Evenson, McKeown, Edwards & Lenahan P.L.L.C.

[57] ABSTRACT

It is an object of the present invention to provide a vertical heat treatment apparatus having a heat insulator, which has sufficient heat insulation, heat retention and high load pressure bearing properties to cope with increased size dimensions and number of layers of wafer workpieces and can be particularly advantageously used as a semiconductor and TFT substrate heat treatment apparatus. The apparatus features the use of a heat insulator casing 40 supporting a substrate holder 3 on its top and receiving a heat insulator 50 having numerous inner microspaces in its lower space, and defining a substrate holder or boat insulator receiving space A and a heat insulator receiving space B such that these spaces are hermetically sealed with respect to each other by the heat insulator casing. It is also a feature of the apparatus that the heat insulator receiving space B is in communication with the exterior or that the pressure in the heat insulator receiving space B can be reduced or increased through a contact section of a closure member 70 which supports the heat insulator casing 40 or a heat insulator casing flange 41.

2 Claims, 7 Drawing Sheets

VERTICAL HEAT-TREATING APPARATUS AND HEAT INSULATOR

This application is a division of application Ser. No. 08/170,164, filed Dec. 23, 1993, now U.S. Pat. No. 5,480,300.

FIELD OF THE INVENTION

The present invention relates to a vertical heat-treating apparatus constructed so that a vertical holder, which is constructed so as to vertically dispose plate-shaped members (hereinafter referred to as substrates), glass substrates or the like such as a semiconductor wafer or liquid crystal one above the other, can be arranged on a heat insulator, and to a heat insulator therefor.

BACKGROUND OF THE INVENTION

Conventionally, there is known a heat-treating apparatus, for example, as shown in FIG. 6, which is constructed to house a wafer holder 3 in which wafers 4 are disposed one above the other within a furnace tube 2 made of silica glass surrounded by heating a means 1 and which performs various heat treatments, such as oxidation, diffusion, vapor phase deposition and annealing, on the surface area of the wafers 4 placed on the wafer holder 3 while heating and maintaining the wafers 4 within a predetermined temperature range by means of the aforementioned heating means 1.

To minimize the space required for installation of this type of heat-treating apparatus, a vertically-structured heat-treating apparatus furnace is usually used in which the foregoing furnace tube 2 is vertically installed. In such an apparatus, however, to prevent variations in the thickness of thin film to be formed or doped on the surfaces of the wafers 4 and in the diffusate density distribution due to uneven temperature, a heat insulator 5 made of silica glass is provided between a heating area A in the furnace tube 2 and the open end of furnace tube 2 to maintain a uniform temperature in the space where the aforementioned wafers 4 are heat-treated. In addition, the heating means 1, which surrounds the aforementioned furnace tube 2, is located above the heat insulator 5 so that the heat insulator 5 functions as a heat insulating material, thereby preventing heat loss through O-rings 6 provided between the open end of the core tube 2 and another sealing member.

Such an apparatus is constructed so that the wafer holder 3 is placed directly on the aforementioned heat insulator 5. However, the heat insulator 5 is generally formed by vacuum sealing lint-like silica glass wool 5b within a sealed cylindrical body 5a made of silica glass, and consequently the heat insulator has low load resistance properties, thus limiting the number and diameter of wafers which can be disposed thereon.

Yet, since the top surface of the aforementioned heat insulator 5 is always exposed to high temperature due to radiant heat from heating means 1 which surrounds the furnace tube 2 above the insulator, if gas (air) remains in the sealed cylindrical body 5a or if pinholes communicating with outside air occur as a result of subsequent cleaning or the like so that the sealing is lost and cleaning liquid or outside air is allowed to enter, the remaining gas (air) or the air or cleaning liquid which has entered the cylindrical body is rapidly heated, thereby further increasing the internal pressure load by thermal expansion or expansion and vaporization, and thus possibly rupturing and destroying the cylindrical body 5a.

To prevent such destruction, ribs, braces or other reinforcing bars have been provided within the foregoing cylindrical body 5a to increase the pressure resistance. In recent years, however, as the diameter of the wafers 4 has become larger and the core tube 2 has been made larger, the diameter of the foregoing heat insulator 5 has also been made larger, which correspondingly decreases the pressure resistance. Accordingly, the number of the aforementioned reinforcing bars to be provided has to be increased in geometric ratio, which makes it more complicated to manufacture the heat insulator 5 and greatly increases the manufacturing cost. In addition, particularly if the diameter of the aforementioned heat insulator 5 is made as large as about 150 to 200 mm, it would be very difficult to design and manufacture an insulator with a large enough number of reinforcing bars to be sufficient to withstand the pressure in a vacuum state and at high temperatures, and as a result, it is not possible to manufacture a heat insulator 5 with such a large diameter.

As a result, even when the furnace tube 2 is made larger with larger diameter wafers 4, it is not possible to correspondingly enlarge the diameter of the aforementioned heat insulator 5. Consequently, the heat from the heat treating space for the wafers 4 within the furnace tube 2 dissipates through the space between the heat insulator 5 and the internal wall surface of the furnace tube 2, thereby causing the heating temperature in the heat treating area A for the aforementioned wafers 4 to fluctuate, and at the same time, making it a problem to prevent high temperatures from spreading to the seal portion at the open end of the furnace tube 2.

For this reason, the present inventors disclosed a technique as shown in FIG. 5, in which, instead of placing a supporting member 3 which serves as a (wafer) holder directly on the foregoing heat insulator 5, the heat insulator 5 is divided into a plurality of cylindrical sub-members 5a, a cylindrical frame body 24 is provided for integrally housing the thus divided cylindrical sub-members 5a, and the structure is arranged so that the aforementioned supporting member 3 is disposed on the aforementioned frame body 24 (Japanese Patent Application No. 62-203499).

In the foregoing apparatus, however, even if the cylindrical sub-members are housed in the frame body 24, they are constructed to be located within the furnace tube 2 in venting communication with the heating area in the vicinity of the supporting member 3 which serves as (wafer) holder. Yet since the aforementioned heat insulator 5 is divided into a plurality of heat sub-insulators which fill its interior, each having a smaller diameter, the function (heat retaining power and heat insulating power) of the heat insulating member itself is adversely affected, and the overall surface area becomes larger. In an apparatus like a CVD apparatus or the like in which vapor phase deposition is carried out in a near vacuum state, for example, gas or particles adsorbed on the surface are scattered during the foregoing vacuum treatment, thus causing the surface of the treated substrate, such as wafer, to be contaminated.

Also, in a preferred embodiment of the foregoing apparatus, hard porous bodies 31 made of silica glass which has a large number of microspaces 31a inside as shown in FIGS. 4(A), (B) and (C), such as sintered silica glass and foamed glass bodies, are used the foregoing heat insulator 5. If, however, the heat insulator is used in the foregoing vacuum or reduced-pressure processing apparatus, a structure is preferred in which the porous body 31 is first subjected to reduced pressure to evacuate it, and then the surface of the porous body 31 is covered and sealed with a transparent glass layer 32 to prevent rupture or damage. However, it is quite difficult to evacuate a porous member existing as an isolated cell or an interconnected cell, and the larger the diameter of the foregoing heat insulating member 5, the more difficult the evacuation is and the longer it takes.

Furthermore, when the heat insulator 5 is constructed to be vented directly to a treatment area for a substrate such as a wafer as mentioned above, a reaction film from the treating gas adheres to the surface of the heat insulating member. To remove the film after the heat treatment, it is necessary to etch and clean the heat insulator 5 with hydrofluoric acid or the like. When the aforementioned glass layer is etched by etch-cleaning, the cleaning liquid may penetrate the interior of the air bubble.

In view of the defects of the prior art, the present invention has been designed, and it is the object of the invention to provide a vertical heat-treating apparatus and a heat insulator with heat insulating and heat retaining properties which have high load resistance and pressure resistance properties capable of processing larger diameter wafers and an increased number of the wafers, which can advantageously be used particularly as a semiconductor, liquid crystal and TFT substrate heat-treating apparatus.

It is another object of the present invention to provide a stable heat insulator capable of being used over a long period of time without the occurrence of any micro-cracking and crazing and further production of peeled substrates, and without collapsing due to progressive cracking even if heat treatment and cooling are repeated many times.

DISCLOSURE OF INVENTION

The present invention proposes an apparatus having the following two features. As the first feature, as shown in FIGS. 1 to 3, a heat insulator casing 40 is provided in a lower portion for defining a heat insulator housing space B for housing a heat insulator 50 comprising a porous body as described above, a substrate holder 3 is provided on the top surface (of the heat insulator casing), and the heat insulator housing space B is air-tightly separated from a substrate housing space A by the heat insulator casing 40. Further, as the second feature, the aforementioned heat insulator housing space B is constructed so that it can communicate with the exterior (of the furnace) or so the pressure therein can be reduced or increased through a base 70 or through a contact portion between a base 70 and a heat insulator casing flange 41 which supports the foregoing heat insulator casing 40.

Moreover, the structure is preferably arranged so that the aforementioned heat insulator 50 and the heat insulator casing 40 are concentrically arranged with respect to the furnace tube 2 respectively, and the bottom surface of the substrate supporting portion of the heat insulator casing 40 can be supported on the top surface of the heat insulator 50.

Moreover, a member 80 of frosted silica glass, porous silica having an apparent density of 0.9 g/cm$^3$ or more, SiC, silicon nitride, polycrystalline or single-crystal silicon, or alumina may advantageously be disposed in a space between the heat insulator 50 and the heat insulator casing 40 and/or at a point where the aforementioned heat insulator 50 has an interior cavity in communication with the heat insulator housing space of the heat insulator casing 40 as shown in FIG. 3.

According to such invention, since the heat insulator housing space B and the substrate holder housing space A are air-tightly separated by the heat insulator casing 40, and the heat insulator housing space B side is maintained in communication with the exterior, it is possible to always maintain the heat insulator housing space B at normal operating pressure, thus making it unnecessary to evacuate the porous member 31 which forms the heat insulator 50. Since it can be formed at normal operating pressure, it becomes easy to increase the diameter of the heat insulator 50.

Also, even in an apparatus for performing vapor phase deposition or oxidation or diffusion in a reduced pressure state or a pressurized state, such as the reduced pressure vapor phase deposition apparatus shown in FIG. 2 or a high-pressure oxidation or diffusion apparatus, the pressure in the aforementioned housing space B may be reduced or increased through a vent hole in the base to substantially the same pressure as in the substrate holder housing space A. In this case, because the heat insulator is composed of a porous member of silica glass instead of wool material, there is no possibility that the ventilation piping system will be clogged up by sucking up wool dust. Also, since each of the housing spaces is maintained at substantially the same pressure, a precision seal such as an O-ring is not always required at sealed portion 22, and instead a sealing method such as fitting may be used.

If the diameter of the heat insulator casing 40 for mounting the holder 3 is increased to correspond to that of the furnace tube 2 as mentioned above, the holder load capacity of the heat insulator casing 40 is correspondingly decreased. However, since the heat insulator 50 of the present invention is composed of a porous member of silica glass which itself exhibits a load strength, the heat insulator 50 and the heat insulator casing 40, respectively, are concentrically disposed with respect to the core tube and the structure is arranged so that the underside of the substrate supporting portion of the heat insulator casing 40 can be supported on the top surface of the heat insulator 50, whereby even when the diameter of the heat insulator casing 40 is increased, the load resistance properties are not decreased, but can fully withstand the load even when a large number of substrates are mounted on the holder 3.

Further, since the heat insulator 50 and the heat insulator casing 40 are formed separately, it is also easy to form the top portion of the heat insulator casing 40 substantially convexly or concavely as shown in FIG. 3, whereby it becomes possible to provide the heat insulator casing 40 with sufficient load and pressure resistance even if the pressure in the heat insulator housing space B is reduced or increased.

Also, since the heat insulator 50 is not exposed to the treatment gas, the only thing to which film adheres and which requires cleaning is the heat insulator casing 40, and cleaning is not only easy, but also a disc member 80 of SiC, silicon nitride or silicon, which have conventionally been regarded as difficult to clean, can be used together with the heat insulator 50 made of silica glass.

Thus, penetration of impurities such as Cu, Na and Fe, for example, which easily penetrate silica glass from the oven inlet side, not only can be prevented by use of a member of SiC, silicon nitride, silicon or alumina, which has high density and high diffusion, transmission and barrier properties, but also the temperature uniformity can be improved by preventing the heat from the furnace from dissipating through radiation in a radial direction by use of a thin sheet made of SiC, silicon nitride, silicon or alumina which has comparatively high heat conductivity and low light transmission properties.

The result of protection against radiation and temperature uniformity can even be attained by using a frosted silica glass member or a porous silica member having an apparent density of 0.9 g/cm³ or more (higher density than the porous member) for example. A frosted silica glass member is particularly capable of maintaining a stable effect because a portion frosted by cleaning can be prevented from becoming transparent.

In particular, a member formed of SiC, silicon nitride, polycrystalline or single-crystal silicon, or alumina is capable of easily retaining the heat of the substrate holder housing space A and maintaining radial temperature uniformity because it has higher heat absorption and heat barrier properties than silica glass.

By providing a cavity inside the aforementioned heat insulator 5 communicating with the heat insulator housing space of the heat insulator casing 40, the heat capacity of the insulator can be decreased without impairing the heat-shield heat retaining properties.

The second invention comprises a structure which can advantageously be used as the aforementioned heat insulator 5, and which is characterized in that the porous body 31 of silica glass which constitutes the heat insulator 50 is composed of a silica glass foam having a communicating air-bubble ratio of 60% or less at an apparent density of 0.1 to 0.8 g/cm³, and containing not more than 1 ppm of Na, K, Li, Cu, Ni, Ca and Ce, respectively, not more than a grand total of 100 ppm of metallic impurities, and not more than 100 ppm of radical OH, although the heat insulator is formed with a porous body 31 made of silica glass having a large number of microspaces 31a inside as shown in FIG. 4 in the same way as in the foregoing prior art.

In this regard, to produce the foregoing silica glass foam, fine silica glass powder is first obtained by heat-treating high-purity synthetic silica glass powder, which contains 1 ppm or less of each of the foregoing metallic impurities which promote semiconductor degradation, by thermal vapor-phase reaction under an ammonia gas atmosphere at 900° C. Then, an open-topped heat-resistant crucible is filled with the resulting fine silica glass powder, and is heated at 1,700° C. in a normal atmosphere under reduced pressure to fuse and foam the fine silica glass powder.

According to the second invention, a low heat capacity and excellent heat-shielding properties are obtained, and yet any occurrence of gas during heating due to moisture absorption can be prevented. Further, silica glass foam for constituting the foregoing heat insulator 50 is amorphous. The grand total amount of metallic impurities which promote the crystallization of silica glass such as, for example, Na, K, Li, Al, Ni, Cu, Ca, Fe and Ce, is 100 ppm or less, and in particular, the content of each of the elements Na, K, Li, Cu, Ni and Ca, which migrate rapidly and easily contribute to crystallization, is 1 ppm or less, respectively. In addition, to maintain the heat resistance, the OH group content is 100 ppm or less. Thus, no deformation or cracking will occur even if the apparatus is heated repeatedly to high temperatures (600° C. to 1,300° C.), thereby enabling the apparatus to be used for a long time.

Since crystallization of silica glass results in a higher coefficient of thermal expansion, crystallization is particularly likely to cause cracking or destroy the silica glass by thermal shock due to a rapid rise in temperature. It is important that the insulator should be completely amorphous, and high purity should be maintained from the beginning.

BEST MODE FOR CARRYING OUT THE INVENTION

Figure 1:
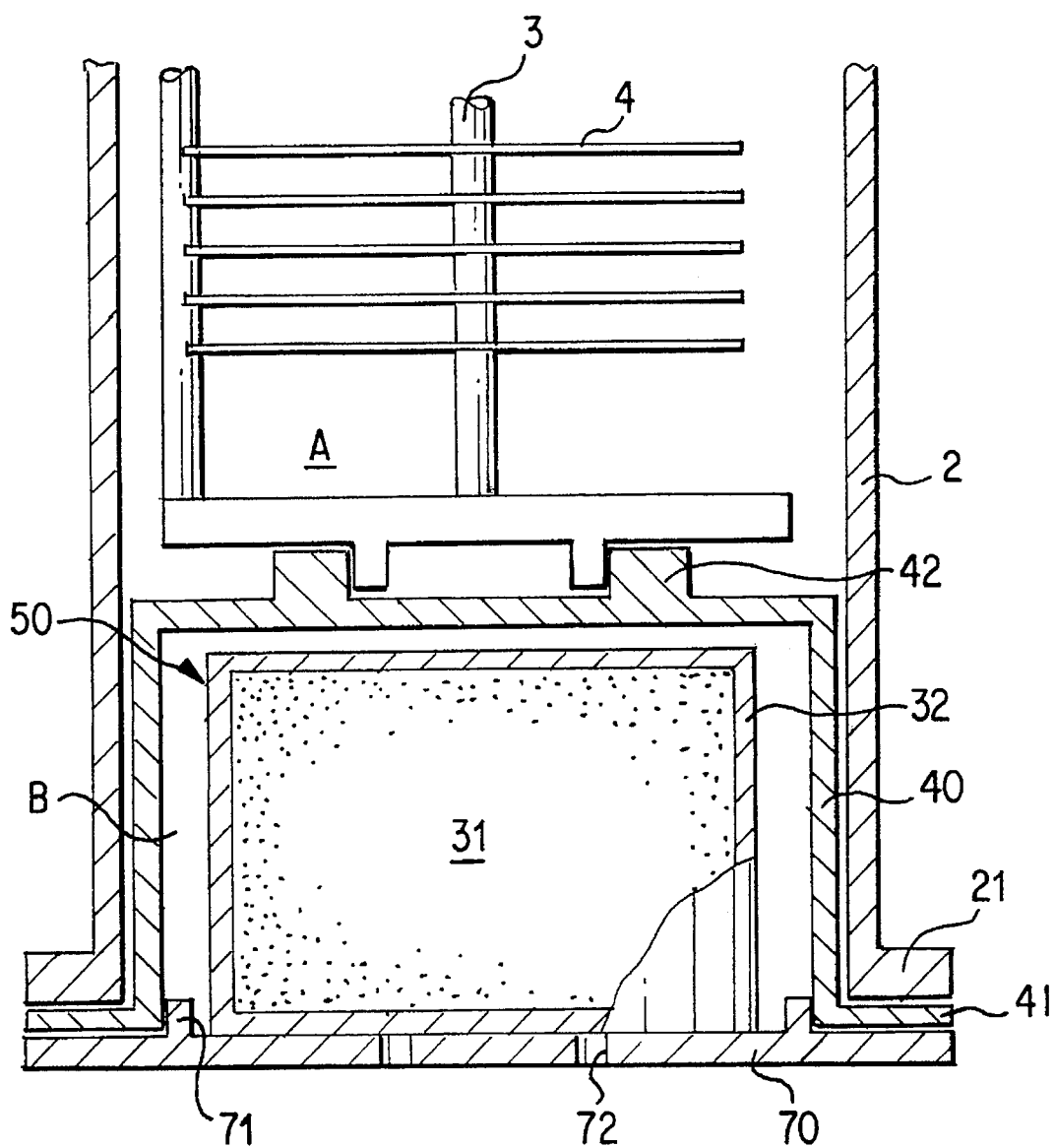
FIGS. 1, 2 and 3 are front sectional views each showing the structure of the principal portion of a respective embodiment of vertical heat-treating apparatus according to the present invention.

FIG. 1 shows the structure of the principal portion of a vertical heat-treating apparatus according to a first embodiment of the present invention comprising the lower portion of a furnace tube 2 in which a heat insulator 50 is arranged.

Reference numeral 2 designates a cylindrical, dome-shaped vertical furnace tube provided with a flange 21 adjacent the opening at its lower end. The vertical core tube is constructed so that the flange 21 can be installed in an air-tight manner on the top surface of a flange 41 on the heat insulator casing.

The outer surface of the heat insulator casing 40 has an outer diameter slightly smaller than the inner diameter of the aforementioned furnace tube 2 and is made of transparent silica glass frosted by sandblasting, and the top surface of the insulator casing is sufficiently flat or level that a substrate holder 3 can be mounted thereon. The flange 41 provided adjacent the opening at the bottom is formed to have the same diameter as the flange 21 on the furnace tube 2. Projecting annular members 42 are provided on the aforementioned flat top surface, and the holder 3 is constructed so that it can be positioned and mounted on the annular members 42.

A closure member 70 is constructed so that it forms a circular plate with the same diameter as the outer diameter of the flange 41 of the aforementioned heat insulator casing 40, and so that the peripheral surface of the closure member 70 can be installed on the underside of the flange 41.

The aforementioned closure member 70 is constructed so that a concentrically projecting annular member 71 is provided on the top surface adjacent the inner wall surface of the heat insulator casing 40 in order to position and install the heat insulator 50 on the annular member 71, and so that a through hole 72 is provided in the central portion of the closure member 70 to form a vent to the exterior.

As a result, since the heat insulator housing space B between the heat insulator casing 40 and the closure member 70 is provided with (external) ventilation, and the furnace tube 2 is air-tightly mounted on the top surface of the heat insulator casing 40, the substrate holder housing space A within the furnace tube 2 and the foregoing heat insulator housing space B are separated from each other in an air-tight manner.

The heat insulator 50 disposed on the aforementioned closure member 70 is formed of a porous silica glass foam member 31 and a transparent silica glass body 32 which surrounds the circumference of the porous member. The silica glass foam has a large number of micro-air bubbles inside with a communicating air-bubble ratio of 20% (volume ratio), an apparent density of 0.3 g/cm, a content of 1 ppm or less of each of Na, K, Li, Al, Ni, Cu, Ca, Fe and Ce, and an OH group content at 10 ppm or less.

The procedure for manufacturing the aforementioned porous member 31 will now be described. First, fine silica glass powder is initially obtained by heat-treating high-purity synthetic silica glass powder, which contains not more than 1 ppm each of almost all metallic impurities, by thermal vapor-phase reaction under an ammonia gas atmosphere at 800° C. Then, an open top crucible made of carbon having a somewhat larger diameter than a surrounding body 32 and a large height to diameter ratio is filled with the resulting fine silica glass powder, and is heated at 1,700° C. in a normal atmosphere under reduced pressure to cause fusion and foaming of the fine silica glass powder, thereby obtaining a silica glass foam which is somewhat larger than surrounding body 32 and contains microspaces inside.

By heating the surface of resulting foam with an oxygen-hydrogen gas burner to fuse and clarify, a shaped porous member 31 of so-called foamed glass formed with a surrounding body 32 made of transparent silica glass, inside of which a thin film of silica glass is spread vertically and horizontally, is produced.

The apparent density of the resulting shaped porous glass member 31 was determined from the weight and the apparent volume. From the apparent density and the weight increase when immersed in liquid, the total communicating porosity (volume ratio) of the inside microspace was determined. Further, the concentration of each of the metallic impurities was investigated using the ICP analysis method, and the OH group content was investigated by the diffuse reflection spectral method using Fourier transform infrared spectroscopy.

As another manufacturing process different from the preferred embodiment, instead of heat-treating using ammonia gas, a foaming agent which reacts and decomposes to produce a gas at high temperatures, such as carbon and an oxidizer or metallic carbonate, can be mixed with the fine silica glass powder, and be fused and foamed at high temperatures to obtain a similar foam. Since the foaming agent can easily remain in the porous member 31 and be gasified or promote crystallization of the porous body 31 during use, the foaming method using ammonia gas is preferred.

In this regard, since the heat insulator housing space B is separated in an air tight manner from the substrate holder housing space A, it is also possible in the present invention to utilize the porous member 31 in "as is" condition as it is removed from the crucible as the heat insulator 50. However, it may be possible to position, for example, a sintered silica body or a silica glass frame inside the aforementioned crucible, and through fusion and foaming to form a sintered silica or silica glass layer.

Since the heat insulator 50 as described above includes the foregoing porous member which itself exhibits load resistance strength, and further includes a thick-walled surrounding body on its surface, it is also possible construct it with a height which is substantially the same as the height of the insulator housing space, so that the underside of the substrate holder supporting surface of the aforementioned heat insulator casing 40 can be supported on the top surface of the heat insulator 50.

A heat insulator 50 constructed in this way was incorporated in an apparatus according to the present invention as shown in FIG. 1, and the temperature was repeatedly raised and lowered about 400 times at 30° C./min between ambient temperature and 1,200° C., and the condition of the porous body 31 was observed. As a result, no deformation or cracking were found at all, and it was shown that the porous body exhibits excellent durability.

Then, a porous body 31 was foamed in an ammonia gas atmosphere at 800° C. as described in the foregoing embodiment 1 except that a fine silica glass powder was used which was obtained by heat-treating a fine natural silica glass powder with a lower purity than the powder used in the foregoing embodiment 1. Thus, a low-purity porous body 31 was obtained comprising silica glass foam having a continuous porosity of 30% (volume ratio), an apparent bulk density of 0.3 g/cm$^3$, and containing about 2 ppm each of Na, K, Li, Ca, Ni and Fe, about 50 ppm of Al, 1 ppm or less of each of Ce and Cu, and an OH group content of 10 ppm or less.

The resulting porous body 31, which is regarded as a first comparative example, was incorporated in the apparatus shown in FIG. 1 in the same manner as in the embodiment 1. The temperature was repeatedly raised and lowered about 400 times at 30° C./min between ambient temperature and 1,200° C. in the same manner as in the embodiment 1, and the condition of the foregoing comparison porous member 31 was observed. As a result, at about the 200th repetition, dusting and peeling were observed due to a large number of microcracks on the surface of the surrounding body, and at about the 400th repetition, the porous member was crazed, and the vent hole was found to be clogged with peeled material.

Moreover, a trace quantity of potassium oxide, calcium carbonate and carbon of 0.4 wt. % was added as an expanding agent to a fine powder of high-purity synthetic silica glass similar to that used in embodiment 1 and mixed by means of an alumina ball mill. Then, the mixture was heated at 1,700° C. in a normal atmosphere under reduced pressure, and the fine silica glass powder was caused to fuse and foam. By treating the resulting foamed glass in the same way as in embodiment 1, a porous body 31 was obtained comprising a silica glass foam having continuous porosity of 70% (volume ratio), an apparent density of 0.4 g/cm, and containing about 1 ppm or less of each of Na, k, Li, Ni and Fe, about 100 ppm of Al, about 8 ppm of each of Ca and Ce, and an OH group content of about 140 ppm.

The resulting porous body 31, which is regarded as a second comparative example, was incorporated in the apparatus shown in FIG. 1 in the same manner as embodiment 1. The temperature was repeatedly raised and lowered about 200 times at 30° C./min between ambient temperature and about 1,200° C. in the same manner as in embodiment 1, and the condition of the porous body 31 was observed. As a result, at about 200th repetition, a large number of microcracks, crazing and peeled material were observed on the same surface as in the embodiment 2, and at about 400th repetition, the porous member partially collapsed due to the progression of large craze and reticulate cracking. Also, the foregoing porous body after the repeated test was thermally deformed and was found to exhibit shrinkage of about 30% in volume.

Following the repeated tests of these first and second comparative examples, a part of each porous body was peeled off and investigated by X-ray diffractometry, and crystalline cristobalite was detected. Thus, it was found that the deterioration in durability was inversely related to the crystallization.

Figure 2:
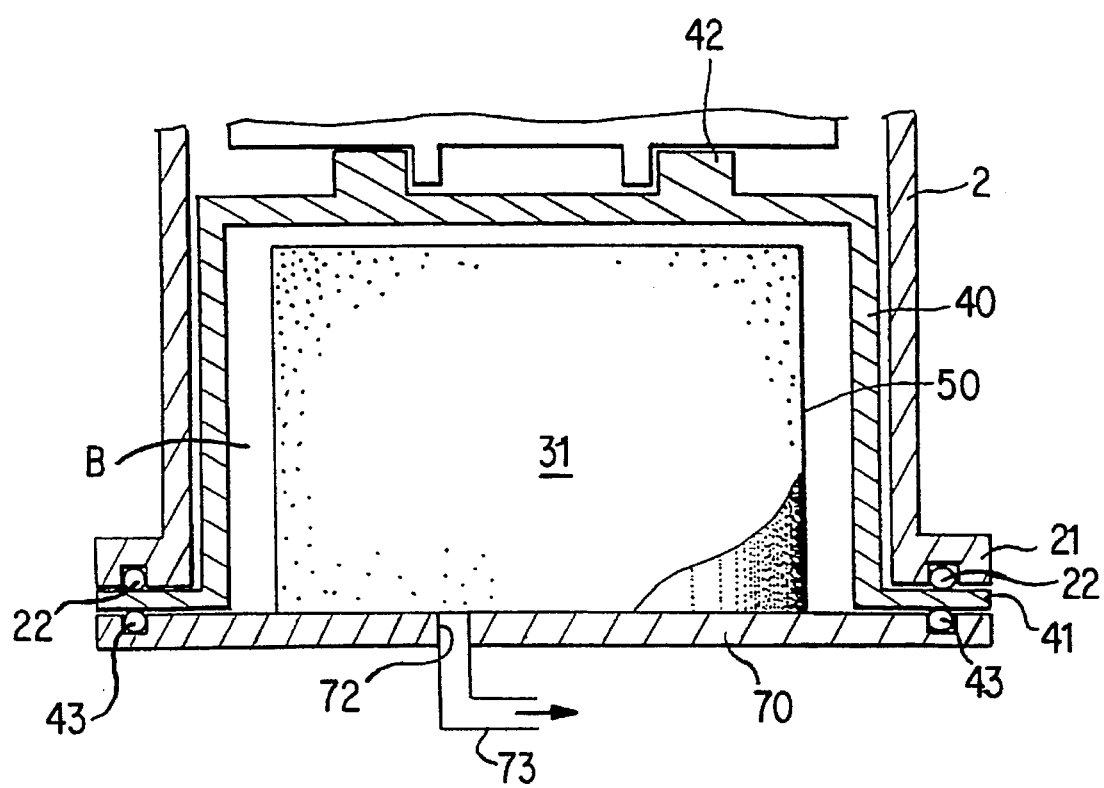

FIG. 2 shows a second embodiment in which the structure (of the invention) is applied to a vapor phase deposition apparatus. The differences between this second embodiment and the foregoing first 1 will mainly be described. A vacuum piping system 73 is connected to a vent hole 72 in the base 70, O-rings 22 and 43 are interposed between flanges 21 and 41 provided adjacent the lower ends of the furnace tube 2 and the heat insulator casing 40, respectively, and the base 70, so that the pressure in the substrate housing space A and that in the heat insulator housing space B can both be reduced or reduced and maintained.

Also, when the pressure in the aforementioned insulator housing space B is decreased through the vent hole 72 in the base 70 at this juncture, there is no possibility that wool dust or peeled material will be sucked into the vacuum piping system 73 and clog it because the heat insulator 50 is made of the foregoing high-purity silica glass porous body instead of wool.

Figure 3:
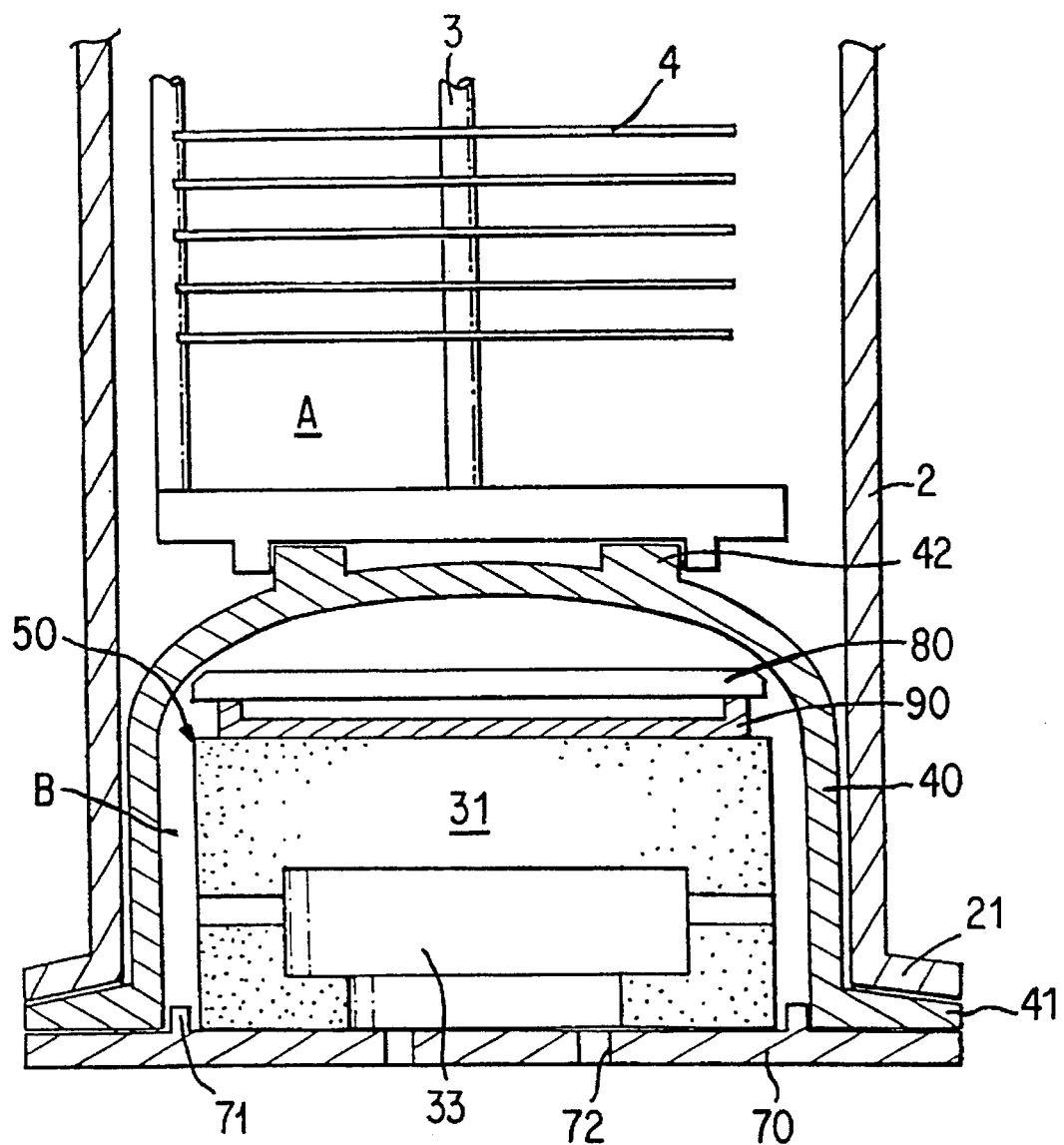
Figure 4A:
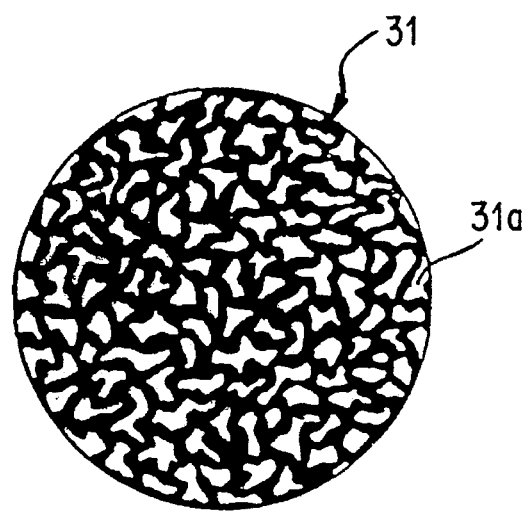
FIGS. 4A, 4B, and 4C are is an enlarged view showing an inner structure of a porous member in accordance with a second aspect of the invention.
Figure 4B:
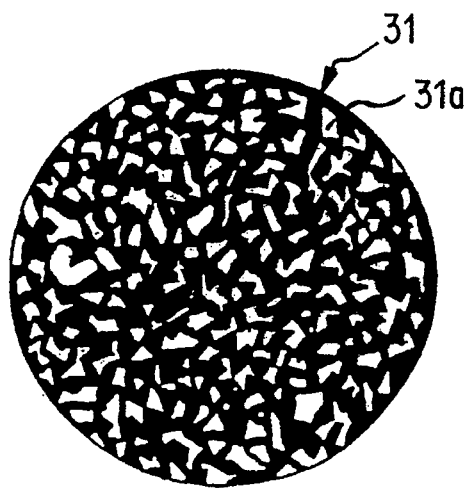
Figure 4C:
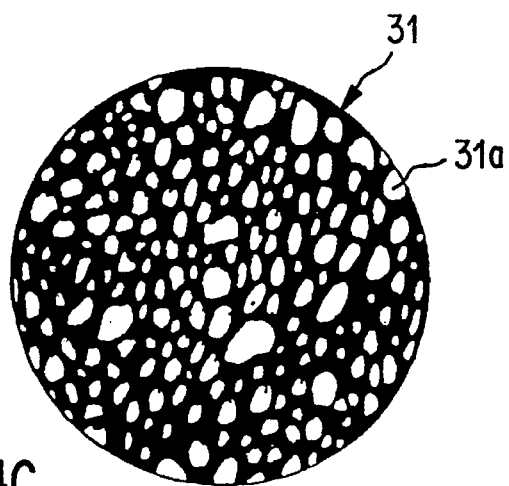

FIG. 3 shows a third embodiment in which the structure is applied to high-pressure oxidation, and its differences from the foregoing first and second embodiments will mainly be described. As in the first embodiment, a through-hole 72 is provided in the central portion of the base 70 so that (the apparatus) can be vented to the exterior. A tapered fitting having a taper of about 5° is provided between flanges 21 and 41, which are formed at the lower ends of the furnace tube 2 and the heat insulator casing 40, so that the internal pressure within the substrate housing space A does not escape outside the apparatus.

Also, an annular member 42 is provided on the top surface of the heat insulator casing 40, so that the substrate holder 3 can be mounted thereon, and the top surface is constructed with an overall convex dome-shaped structure so that it can withstand the treating gas pressure in the substrate holder housing space A.

Also, a silicon disc member 80 is mounted by means of a leg base 90 made of silica glass on top of the heat insulator 50 in the heat insulator housing space B between the aforementioned heat insulator casing 40 and the heat insulator 50, whereby the temperature uniformity at the oven inlet is improved in the radial direction.

Also, a cavity 32 is provided inside the aforementioned heat insulator 50 which communicates with the heat insulator housing space B in the heat insulator casing 40, whereby the heat capacity can be decreased without impairing the heat-shield heat retaining properties, thus improving the temperature controllability of the furnace tube 2.

Industrial Applicability

As mentioned above, the present first invention is advantageously applicable to processing apparatus operating under reduced pressure or under pressure in vapor phase deposition, high-pressure oxidation, or the like, which remains durable over a long period of time even when the temperature is repeatedly raised and lowered while sufficiently satisfying the requirements for heat-shielding, heat-retention, thermal load resistance and pressure resistance properties adequate to support larger diameter substrates and/or an increased number of substrates.

Figure 5A:
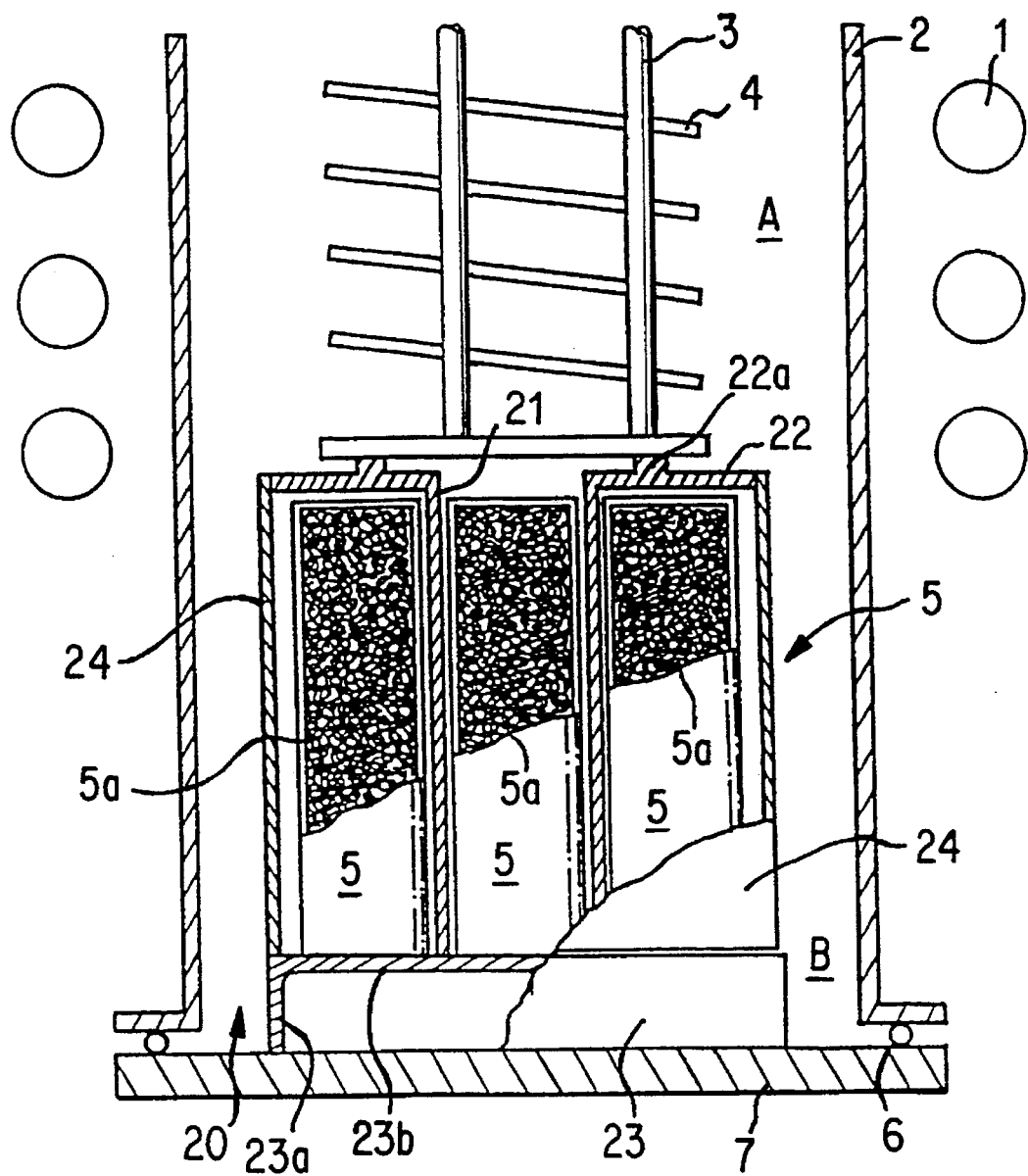
FIGS. 5A and 5B show the structure of the principal portion of a vertical heat-treating apparatus according to a prior art, with FIG. 5A being a front sectional view and FIG. 5B being a plan view showing the upper surface of a heat insulator.
Figure 5B:
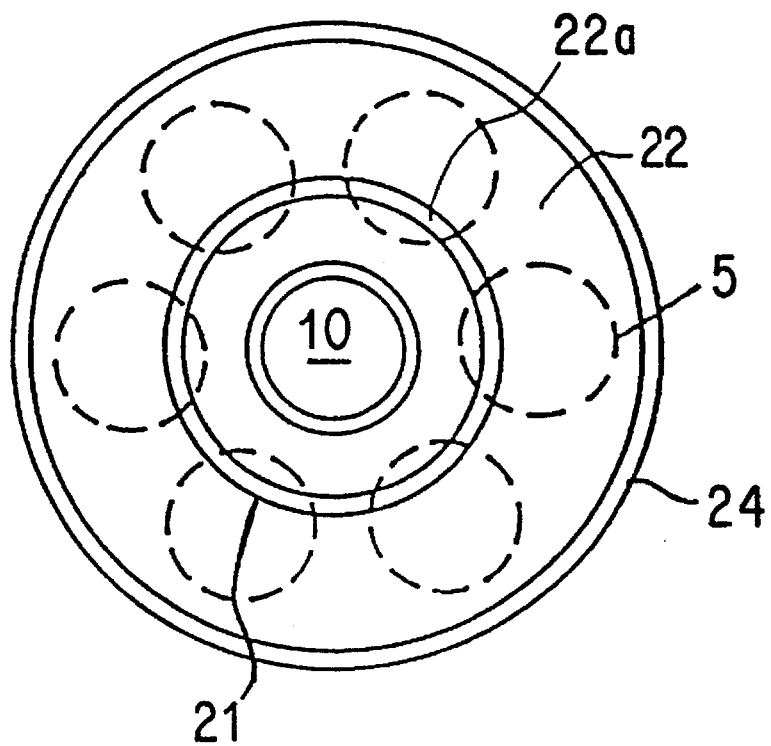
Figure 6:
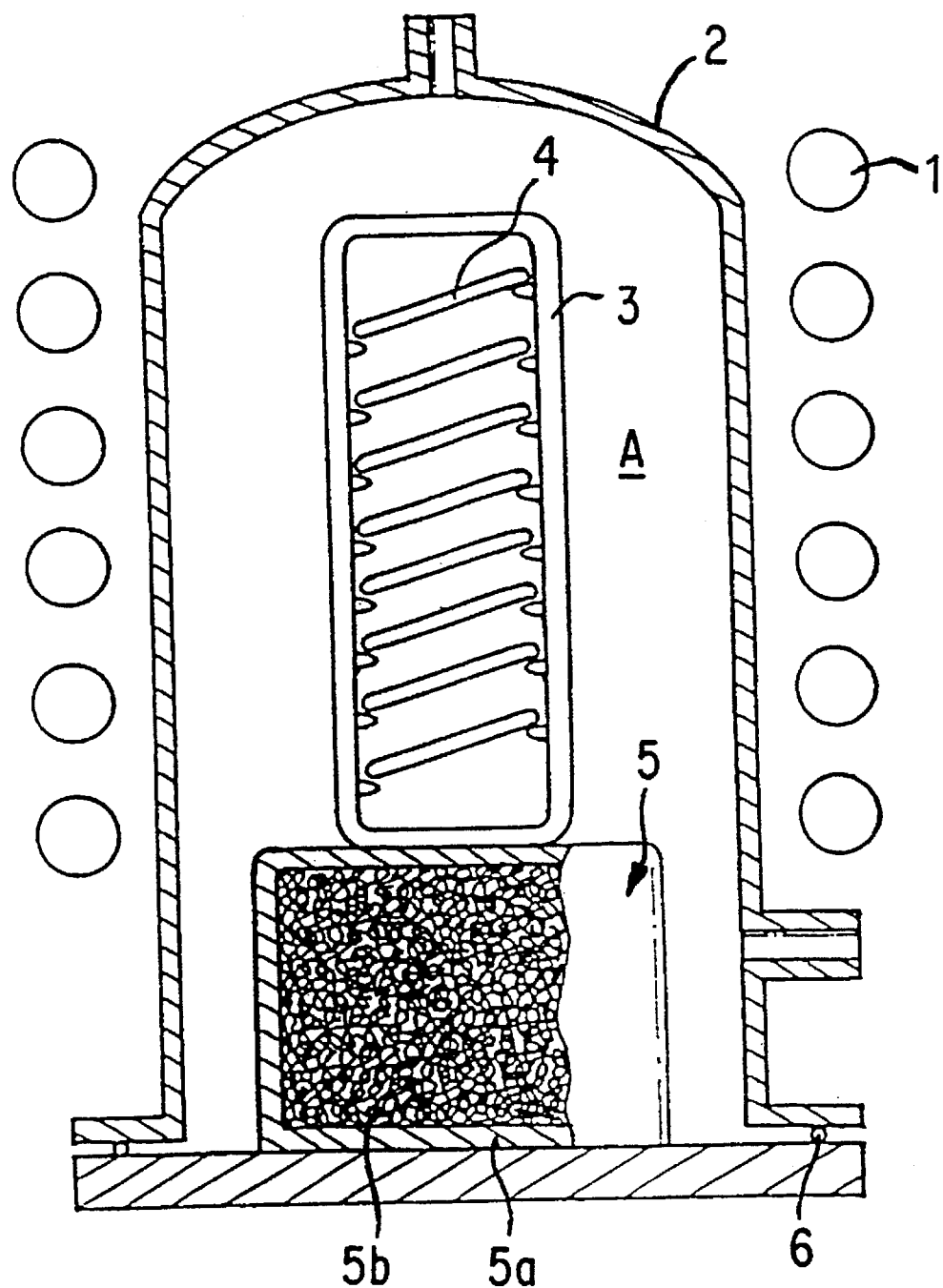
FIG. 6 is an overall front sectional view showing a conventional heat-treating apparatus.

Also, according to the second invention, it is possible to obtain a stable heat insulator which can be used for a long period of time without the occurrence of microcracks, crazing and peeled substrates, and without collapsing due to progression of such cracks even if heating and cooling are repeated many times. The second invention is applicable not only to the foregoing first invention, but also to the apparatus shown in FIGS. 5 and 6.

What is claimed is:

1. A heat insulator disposed between a heating and a non-heating zone in a furnace core tube for insulating and retaining heat in said heating zone, wherein said heat insulator is formed with a porous body of quartz glass having numerous inner microspaces, said porous body comprising a quartz glass foam having an apparent density of 0.1 to 0.8 $g/cm^3$, a continuous porosity of 60% or less, concentrations of each of Na, K, Li, Cu, Ni, Ca and Ce of 1 ppm or less, a total concentration of metallic impurities of 100 ppm or less, and an OH group content of 100 ppm or less.

2. A heat insulator disposed between a heating and a non-heating zone in a furnace core tube for insulating and retaining heat in said heating zone, wherein said heat insulator is formed with a porous body of quartz glass having numerous inner microspaces, said porous body comprising a quartz glass foam having an apparent density of 0.1 to 0.8 $g/cm^3$, a continuous porosity of 60% or less, concentrations of each of Na, K, Li, Cu, Ni, Ca and Ce of 1 ppm or less, a total concentration of metallic impurities of 100 ppm or less, and an OH group content of 100 ppm or less, and said quartz glass foam containing interior microspaces is obtained by preparing silica glass powder by heat treating high-purity synthetic silica glass powder, which contains 1 ppm or less each of semiconductor-degrading metal impurities, by thermal vapor-phase reaction in an ammonia gas atmosphere at 800° C., and fusing and foaming said silica glass powder in a heat-resistant crucible by heating to 1,700° C. under a reduced pressure atmosphere.

\* \* \* \* \*